(12) United States Patent
Mills et al.

(10) Patent No.: US 7,268,558 B2
(45) Date of Patent: Sep. 11, 2007

(54) CIRCUIT BREAKER TESTER INCLUDING A PULSE WIDTH MODULATION CIRCUIT

(75) Inventors: Patrick W. Mills, Bradenton, FL (US); Kevin D. Gonyea, Bradenton, FL (US); Richard G. Benshoff, Sarasota, FL (US); Jeffrey C. Lawton, Camarillo, CA (US); Maurice R. Ellsworth, Bradenton, FL (US)

(73) Assignee: Eaton Corporation, Cleveland, OH (US)

( * ) Notice: Subject to any disclaimer, the term of this patent is extended or adjusted under 35 U.S.C. 154(b) by 196 days.

(21) Appl. No.: 11/216,727

(22) Filed: Aug. 31, 2005

(65) Prior Publication Data

US 2007/0047161 A1 Mar. 1, 2007

(51) Int. Cl.
*G01R 31/327* (2006.01)
*H01H 31/02* (2006.01)

(52) U.S. Cl. .................................. 324/424; 324/555

(58) Field of Classification Search ............... 324/424, 324/555
See application file for complete search history.

(56) References Cited

U.S. PATENT DOCUMENTS

| 5,416,416 | A | 5/1995 | Bisher |
|---|---|---|---|
| 5,583,440 | A | 12/1996 | Bisher |
| 6,072,317 | A | 6/2000 | Mackenzie |
| 6,084,756 | A | 7/2000 | Doring et al. |
| 6,466,029 | B2 | 10/2002 | Stroth et al. |
| 6,734,682 | B2 | 5/2004 | Tallman et al. |
| 6,744,260 | B2 | 6/2004 | Schmalz et al. |
| 6,765,390 | B2 | 7/2004 | Elms |
| 6,785,104 | B2 | 8/2004 | Tallman et al. |
| 6,850,073 | B2 | 2/2005 | Elms et al. |
| 2004/0218330 | A1 | 11/2004 | Natili et al. |
| 2005/0089079 | A1 | 4/2005 | Engel |

*Primary Examiner*—Anjan Deb
*Assistant Examiner*—Timothy J Dole
(74) *Attorney, Agent, or Firm*—Loren H. Uthoff, Jr.

(57) ABSTRACT

A tester for testing a circuit breaker includes a plurality of load elements each having a nominal fixed impedance and an electronic switch associated with each load element. The electronic switch, when turned on, electrically connects a corresponding load element in series with a circuit breaker load terminal and in parallel with none or with a number of other load elements. A controller turns on a number of the electronic switches selected to draw through a corresponding number of the load elements a test current selected as a function of a designated rated current for the circuit breaker and sufficient to trip open the same. A pulse width modulation circuit cooperates with the controller and with the electronic switches. The pulse width modulation circuit provides a constant magnitude of the test current to accommodate variations of the nominal fixed impedance or variations of the voltage of the load terminal.

22 Claims, 13 Drawing Sheets

CIRCUIT BREAKER TESTER INCLUDING A PULSE WIDTH MODULATION CIRCUIT

BACKGROUND OF THE INVENTION

1. Field of the Invention

This invention relates to equipment for testing in situ the trip functions of circuit breakers which may have a range of rated currents and/or line voltages.

2. Background Information

Circuit breakers in some applications are tested periodically to assure reliability. This is particularly so in aircraft electrical systems. It is preferable that the circuit breakers be tested in their installed state. The job is made more difficult by the high density of these very small circuit breakers and the fact in any one aircraft system, the breakers can have a range of current ratings. Furthermore, aircraft circuit breakers are now being offered with multiple trip functions.

U.S. Pat. No. 6,744,260 discloses a tester employing various power resistors for testing delayed trip and arc fault trip functions. A suitcase enclosure encloses the portable tester. A test selector switch includes one position for a thermal trip test, a second position for a delayed trip test, and a third position for an arc fault test. Due to power dissipation requirements for thermal overload testing, a separate, high-power, less portable module containing high power output stages and load resistors is connected to a printed circuit board though a connector. A controller includes a full wave rectifier so that the current through the load elements is direct current. In this case, a zero crossing detector synchronizes turning on of the electronic switches with half cycles of the alternating current.

There is a need for an improved circuit breaker tester that is portable, relatively small, and relatively light-weight for use in situ testing of circuit breakers, and particularly, installations with circuit breakers having a range of current and/or line voltage ratings.

There is room for improvement in testers for circuit breakers.

SUMMARY OF THE INVENTION

These needs and others are met by the present invention, which provides a circuit breaker tester including a pulse width modulation circuit providing a constant magnitude of test current to accommodate variations of nominal fixed impedance of load elements or variations of load terminal voltage.

In accordance with an aspect of the invention, a tester for testing a circuit breaker under test including a line terminal, a load terminal having a voltage, and a designated rated current, comprises: a plurality of load elements each having a nominal fixed impedance; an electronic switch associated with each of the load elements, the electronic switch, when turned on, electrically connecting a corresponding one of the load elements in series with the load terminal of the circuit breaker under test and in parallel with none or with a number of other of the load elements electrically connected in series with the load terminal; a controller structured to turn on a number of the electronic switches selected to draw through a corresponding number of the load elements a test current selected as a function of the designated rated current for the circuit breaker under test and sufficient to trip open the circuit breaker under test; and a pulse width modulation circuit cooperating with the controller and with the electronic switches associated with the load elements, the pulse width modulation circuit being structured to provide a constant magnitude of the test current to accommodate variations of the nominal fixed impedance or variations of the voltage of the load terminal.

The controller may include a processor having a routine, a first output with a pulse width modulation signal and a plurality of second outputs, one for each of the electronic switches. The pulse width modulation circuit may include a plurality of AND functions, one for each of the electronic switches, each of the AND functions including a first input inputting a corresponding one of the second outputs of the processor, a second input inputting the first output with the pulse width modulation signal, and a third output controlling a corresponding one of the electronic switches. The routine of the processor may be structured to provide the constant magnitude of the test current to accommodate the variations of the nominal fixed impedance and the variations of the voltage of the load terminal.

The pulse width modulation circuit may include a pulse width modulation signal having a duty cycle. The controller may include a sensor electrically interconnected with the load terminal of the circuit breaker under test, the controller increasing the duty cycle responsive to decreases of the voltage of the load terminal, the controller decreasing the duty cycle responsive to increases of the voltage of the load terminal.

Some of the load elements may have different values of the nominal fixed impedance. The controller may be structured to sense the test current and to select a number of the load elements and a corresponding number of the electronic switches, in order to provide as the test current the designated rated current for the circuit breaker under test.

Some of the load elements may have the same values of the nominal fixed impedance. The controller may further be structured to employ different ones of the load elements having one of the same values of the nominal fixed impedance for subsequent tests of the circuit breaker under test or of at least one different circuit breaker, in order to avoid overheating of the different ones of the load elements having one of the same values of the nominal fixed impedance.

Some of the load elements may have minimum values of the nominal fixed impedance. The controller may be further structured to delay some of the tests employing the load elements having the minimum values of the nominal fixed impedance for subsequent tests of the circuit breaker under test or of at least one different circuit breaker, in order to avoid overheating of a number of the load elements having the minimum values of the nominal fixed impedance.

The controller may be structured to test a range of rated currents including a first designated rated current and a greater second designated rated current. The controller may be further structured to control a plurality of thermal tests of the circuit breaker under test including a predetermined multiple of the first designated rated current and the greater second designated rated current. The controller may include a timer structured to delay for a predetermined time a subsequent one of the thermal tests of the circuit breaker under test with the greater second designated rated current, and to not delay a subsequent one of the thermal tests of the circuit breaker under test with the first designated rated current.

The controller may be structured to control an arc fault test of the circuit breaker under test including a selected one of an alternating current arc fault waveform having a substantial step change, and a direct current arc fault waveform having a first predetermined frequency and a magnitude of about a second predetermined multiple of the designated rated current of the circuit breaker under test.

The controller may be structured to control a thermal test of the circuit breaker under test including a selected one of an alternating current value having a magnitude that is a predetermined multiple of the designated rated current and a direct current value having a magnitude that is a predetermined multiple of the designated rated current.

The tester may be portable. The controller may be structured to select and test one of a thermal test and an arc fault test for the circuit breaker under test.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

As employed herein, the expression "a number of" and variations thereof shall refer broadly to any positive integer (e.g., the integer one; the integer two; any suitable greater integer).

As employed herein, the term "controller" shall expressly include, but not be limited by, any suitable circuit (e.g., without limitation, analog, digital, processor and/or combinations thereof) that controls and/or monitors a test of a circuit breaker.

As employed herein, the term "processor" shall expressly include, but not be limited by, a workstation, a personal computer, a microprocessor, a microcontroller, a microcomputer, a central processing unit, a mainframe computer, a mini-computer, a server, a networked processor, or any suitable processing device or apparatus.

The invention will be described as applied to the testing of one or more circuit breakers in an aircraft electrical system including an alternating current (AC) generator, although the invention is applicable to testers for a wide range of circuit breakers in a wide range of different applications, including, for example, those employing a direct current (DC) generator or other suitable power source (e.g., without limitation, power supply; power generator).

Figure 1:
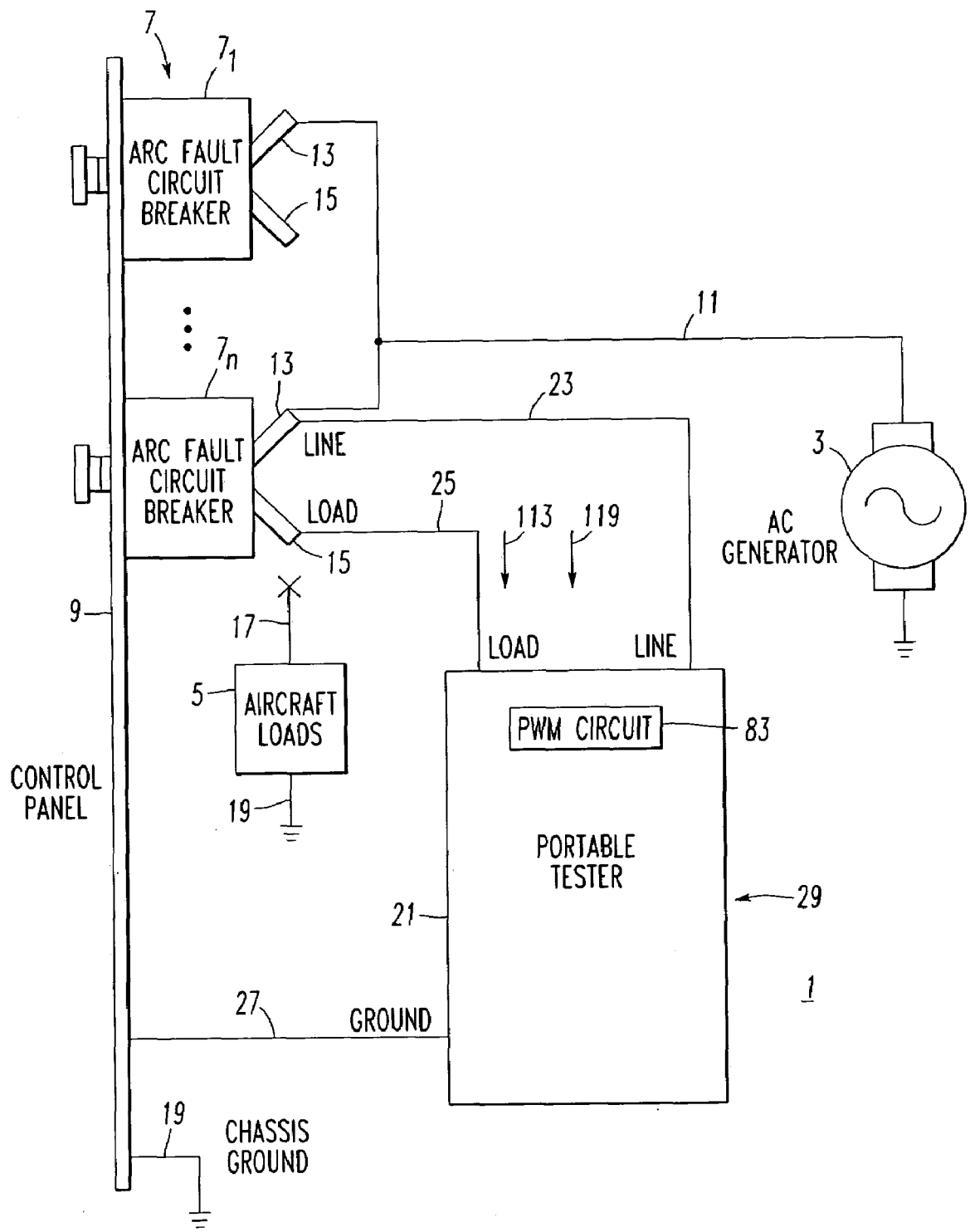
FIG. 1 is a schematic diagram of a tester in accordance with the invention connected for testing a circuit breaker in an aircraft electrical system.

Referring to FIG. 1, an aircraft electrical system 1 includes an AC generator 3 that provides electrical power to aircraft loads 5 through a plurality of circuit breakers 7, such as $7_1$-$7_n$, mounted in a control panel 9. The line conductor 11 from the AC generator 3 is connected to the line terminal 13 on each of the circuit breakers. The aircraft loads 5 are connected to the load terminals 15 of the circuit breakers by load conductors 17 (only one of which is shown). The aircraft frame forms the ground 19. The line conductor 11 may be powered from an AC power source or a DC power source (not shown).

The circuit breakers $7_1$-$7_n$ preferably provide multiple example protection functions, namely: thermal protection, short delay protection, and arc fault protection. The thermal protection responds to persistent overload currents. The short delay protection responds to relatively higher level currents of relatively short duration. Arc fault protection responds to characteristic patterns of current produced by arcing; for instance, the random intermittent nature of arc fault currents.

In order to test the protection functions of the circuit breakers $7_1$-$7_n$, a tester 21 is provided. Due to the relatively large number of circuit breakers $7_1$-$7_n$ in an aircraft electrical system, and the need to maximize in service time of the aircraft, it is desirable that the circuit breakers 7 be tested in situ. Accordingly, the tester 21 includes a line lead 23 and a load lead 25 that can be connected directly to the line terminal 13 and load terminal 15 of a circuit breaker under test (e.g., circuit breaker $7_n$ in this example). During test, the load conductor 17 is disconnected from the load terminal 15, as shown in FIG. 1 by the "X". A ground lead 27 is connected between the control panel 9 and the tester 21. The tester 21 is powered by the AC or DC power source through the line lead 23 connected to the line terminal 13 and the ground lead 27. Thus, the tester 21 does not require a battery.

EXAMPLE 1

Figure 4:
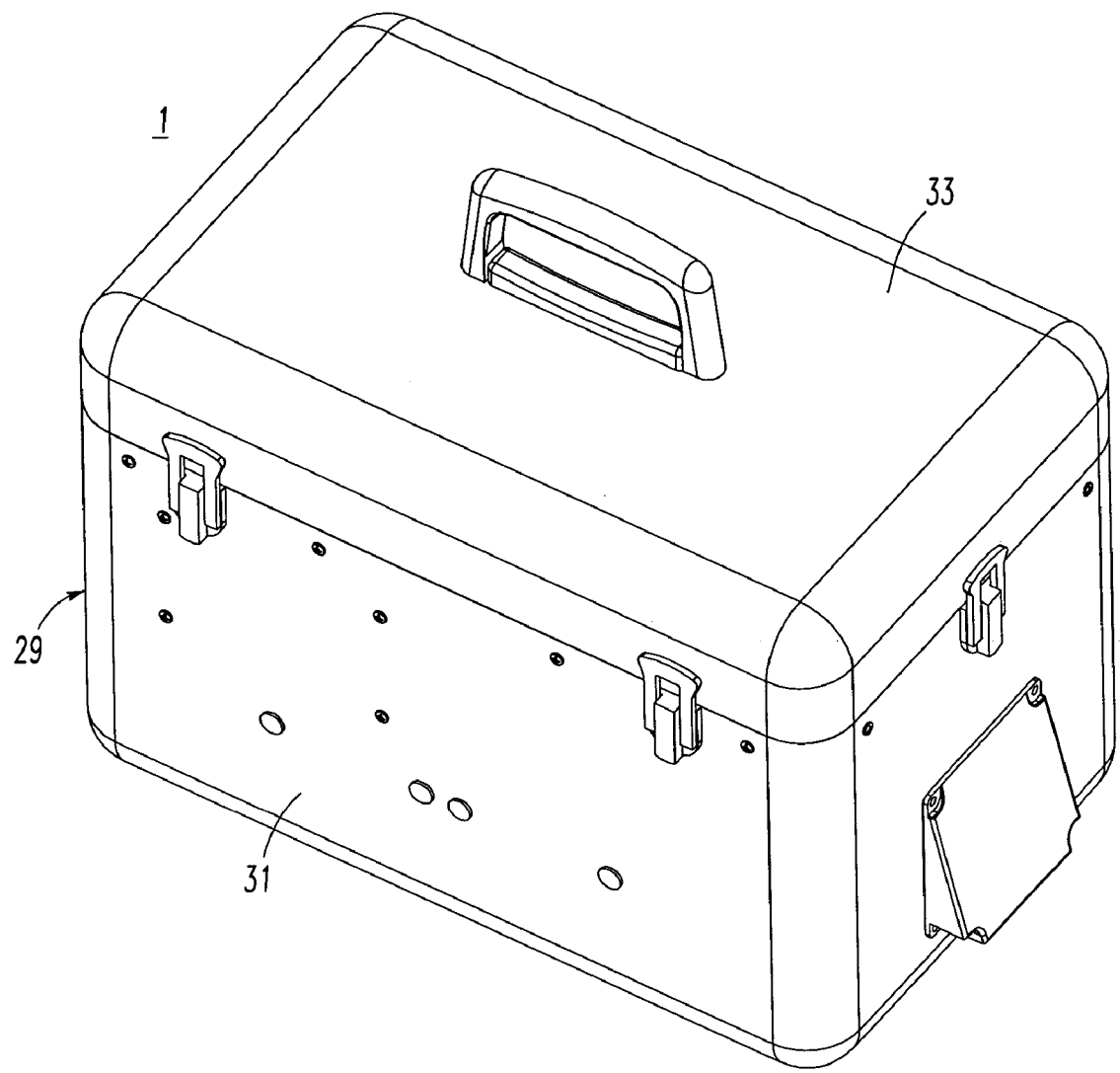
FIG. 4 is an isometric view of the tester of FIG. 1.

The tester 21 is preferably housed in a suitcase-like enclosure 29 (FIGS. 4 and 5) for portability. The enclosure 29 includes a base 31 and a cover 33 (which is removed in FIG. 5 for convenience of illustration).

EXAMPLE 2

The tester 21 is preferably structured to select and test one of a thermal test and an arc fault test for one of the circuit breakers 7 under test. As will be described, the tester 21 preferably tests both arc fault and non-arc fault circuit breakers on either AC or DC loads, in various current ranges and/or line voltage ranges, and in various types of tests.

Figure 2:
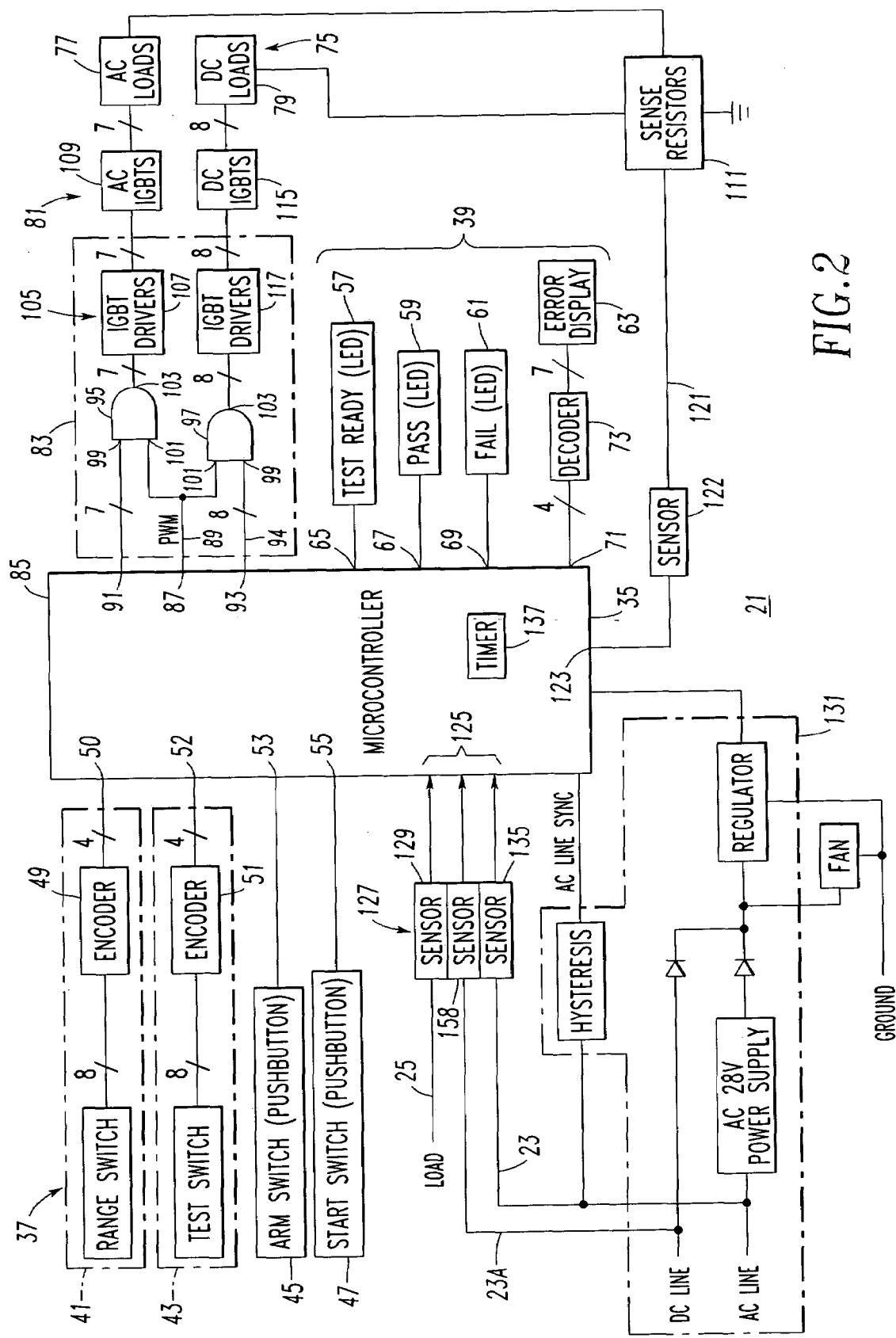
FIG. 2 is a block diagram in schematic form of the tester of FIG. 1.

Referring to FIG. 2, the example tester 21 includes a suitable controller, such as, without limitation, a microcontroller (μC) 35, a plurality of user inputs 37 and a plurality of indicators 39. The user inputs 37 include a rotary range switch 41, a rotary test switch 43, an arm pushbutton 45 and a start pushbutton 47. A first encoder 49 of the range switch 41 encodes eight positions of the range switch to four inputs 50 of the μC 35, and a second encoder 51 of the test switch 43 encodes eight possible positions (only four positions are employed) of the test switch to four μC inputs 52. The arm pushbutton 45 and the start pushbutton 47 are input by μC inputs 53 and 55, respectively. The indicators 39 include a test ready LED 57, a pass LED 59, a fail LED 61 and an error display 63 as output by μC outputs 65, 67, 69 and 71, respectively. The four μC outputs 71 are decoded by decoder 73 for input by the error display 73.

In accordance with an important aspect of the invention, a plurality of load elements 75 of the tester 21 have nominal fixed impedances. The load elements 75 include a number of AC load elements 77 and a number of DC load elements 79. An electronic switch, such as, for example and without limitation, a power IGBT 81, is associated with each of the load elements 75. The power IGBT 81, when turned on, electrically connects a corresponding one of the load elements 75 in series with the load terminal 15 (FIG. 1) of the circuit breaker 7 under test and in parallel with zero or a number (zero or more) of others of the load elements 75 that may be selectively electrically connected in series with the load terminal 15. The μC 35 is structured to turn on a number of the power IGBTs 81 selected to draw through a corresponding number of the load elements 75 a test current selected as a function of the designated rated current for the circuit breaker 7 under test and sufficient to trip open such circuit breaker under test. A pulse width modulation (PWM) circuit 83 cooperates with the μC 35 and with the power IGBTs 81 associated with the load elements 75. The PWM circuit 83 provides a constant magnitude of the test current to accommodate variations of the nominal fixed impedance of the load elements 75 and/or variations of the voltage of the load terminal 15 (FIG. 1).

The μC 35 includes a routine 85, a first output 87 with a PWM signal 89 and a plurality of second outputs 91,93, one for each of the power IGBTs 81. The PWM circuit 83 includes a plurality of AND functions 95,97, one for each of the power IGBTs 81. Each of the AND functions 95,97 includes a first input 99 inputting a corresponding one of the second outputs 91,93, a second input 101 inputting the first output 87 with the PWM signal 89, and a third output 103 controlling a corresponding one of the power IGBTs 81. The μC routine 85 is structured to provide the constant magnitude of the test current to accommodate the variations of the nominal fixed impedance of the load elements 75 and the variations of the voltage of the load terminal 15 (FIG. 1).

Figure 7:
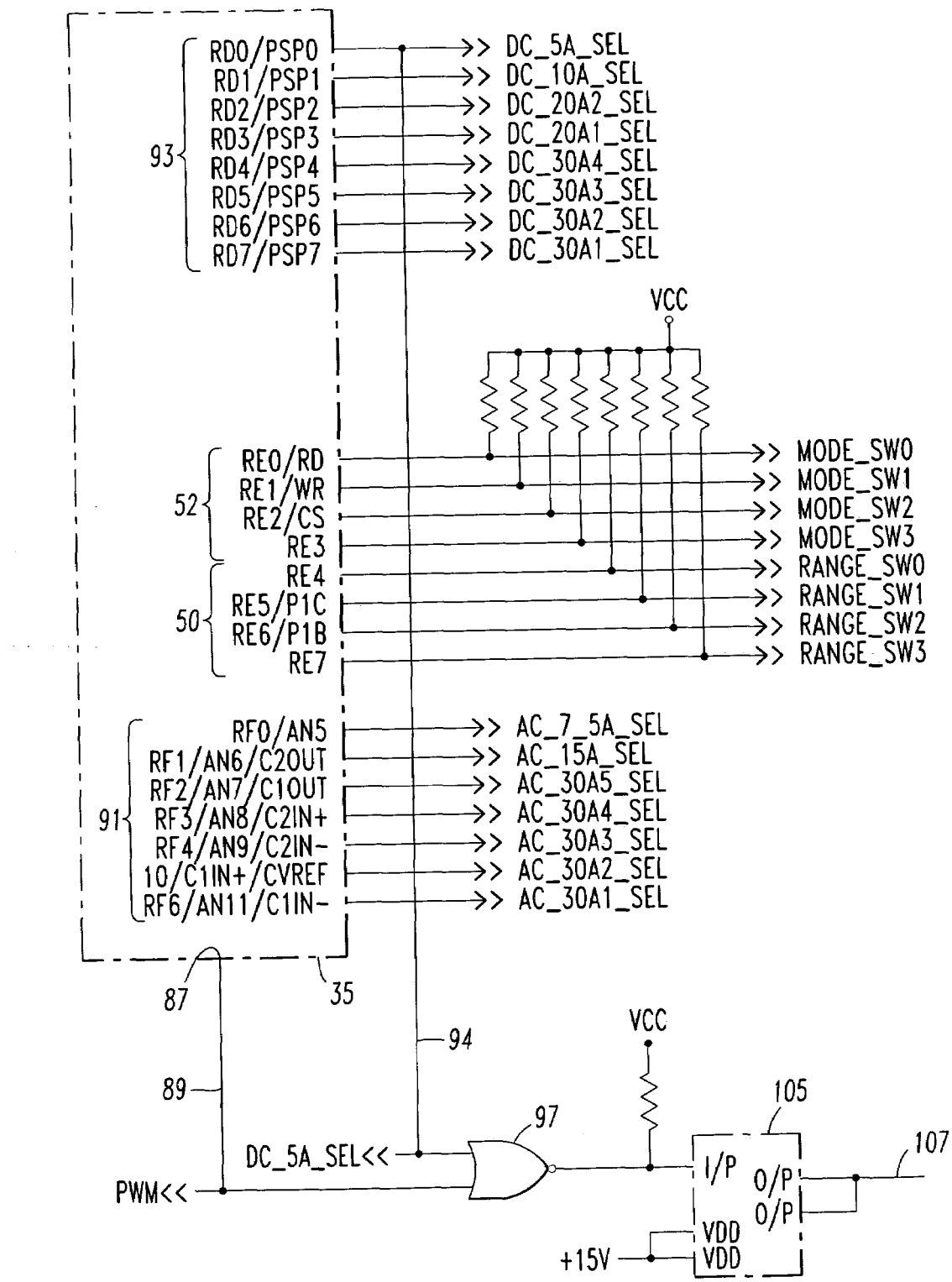
FIG. 7 is a schematic diagram showing the mode and range select inputs, the DC resistor select outputs, the AC resistor select outputs and one of the IGBT drivers of the microcontroller of FIG. 2.

FIG. 7 shows the μC 35 including the range select inputs 50, the mode select inputs 52, the AC resistor select outputs 91, and the DC resistor select outputs 93 along with one of the AND functions 97 and IGBT drivers 105 of FIG. 2. In this example, the AND function 97 is provided by an example NOR gate, in which the select signal 94 and the PWM signal 89 are low-true signals. The IGBT driver 105 has an output 107. Although for simplicity of illustration, only one of the AND functions 97 and one of the IGBT drivers 105 of FIG. 2 are shown, it will be appreciated, as was discussed above in connection with FIG. 2, that these functions are repeated for each of the load elements 75 of FIG. 2.

Figure 8:
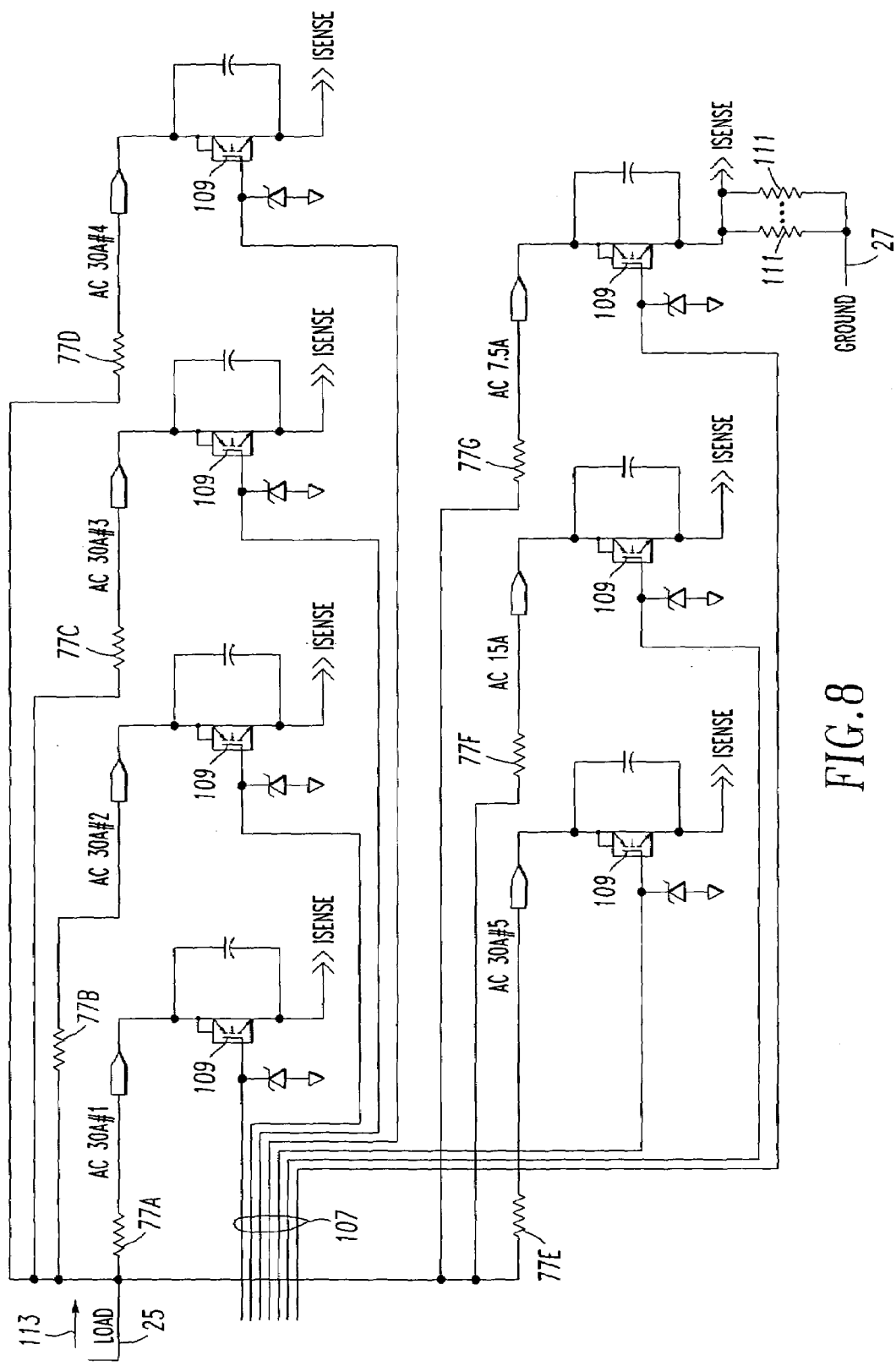
FIG. 8 is a schematic diagram showing the AC resistor drivers and sense logic of the tester of FIG. 1.

FIG. 8 shows the AC resistor power IGBTs 109 of FIG. 2 and sense resistors 111 for the tester 21. In this example, there are seven power IGBTs 109, one for each of the different AC load elements 77, which are shown as resistors 77A,77B,77C,77D,77E,77F,77G in FIG. 8. Each of the outputs 107 of the IGBT drivers 105 of FIG. 2 drives a corresponding one of the power IGBTs 109. The current path for the AC test current 113 from the circuit breaker 7 under test is through the load lead 25, through a selected one or more of the different AC load elements 77, through a corresponding selected one or more of the power IGBTs 109, through the one or more sense resistors 111, and through the ground lead 27.

Figure 9:
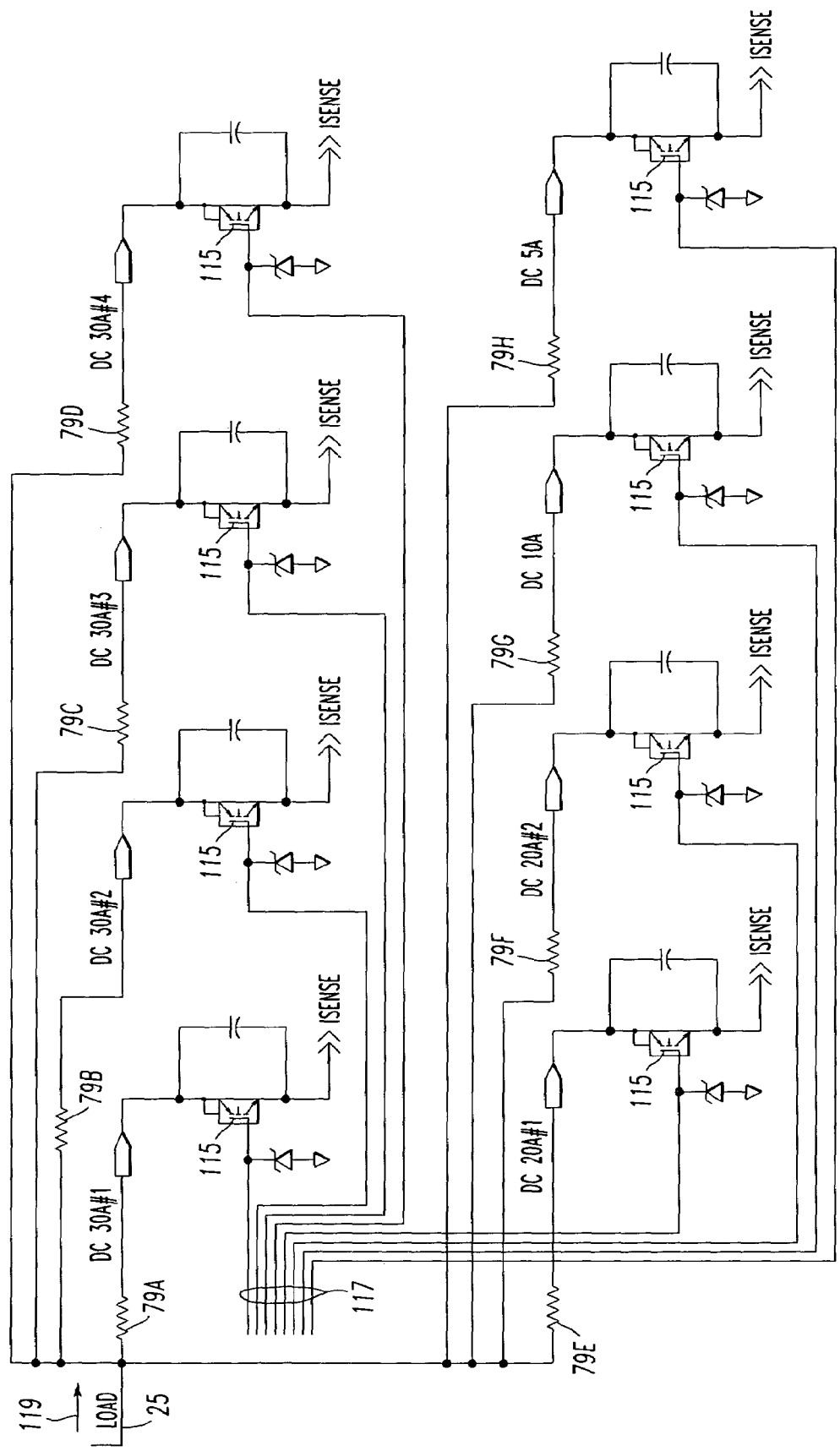
FIG. 9 is a schematic diagram showing the DC resistor drivers of the tester of FIG. 1.

FIG. 9 shows the DC resistor power IGBTs 115 of FIG. 2, which employ the sense resistors 111 of FIG. 8. In this example, there are eight power IGBTs 115, one for each of the different DC load elements 79, which are shown as resistors 79A,79B,79C,79D,79E,79F,79G,79H in FIG. 9. Each of the outputs 117 of the IGBT drivers 105 of FIG. 2 drives a corresponding one of the power IGBTs 115. The current path for the DC test current 119 from the circuit breaker 7 under test is through the load lead 25, through a selected one or more of the different DC load elements 79, through a corresponding selected one or more of the power IGBTs 115, through the one or more sense resistors 111 (FIG. 8), and through the ground lead 27 (FIG. 8).

Referring again to FIG. 2, the PWM circuit 83 is structured to maintain a constant magnitude of the AC or DC test currents 113,119 (FIG. 1) to accommodate various values of impedance between the tester 21 and the circuit breaker 7 under test. The sense resistors 111 sense the corresponding test current and output a sensed current signal 121, which is input through a sensor 122 by an input 123 of the μC 35.

As will be discussed, the PWM signal 89 has a variable duty cycle, which is suitably adjusted by the μC routine 85 based upon the sensed current signal 121, in order to accommodate, for example, variations of the nominal fixed impedance of the load elements 75. Furthermore, the μC 35 includes a number of analog inputs 125 from sensors 127 associated with the load lead 25, the AC line lead 23 and a DC line lead 23A. This permits the μC 35 to determine at least the voltage of the load terminal 15 of the circuit breaker 7 under test. Also, from the inputs 50,52 associated with the range and test-switches 41,43, the μC 35 determines the requested current for a particular test given an expected AC or DC line and load voltage for the circuit breaker 7 under test. This will be discussed in greater detail, below, in connection with Examples 6-8. Initially, the μC routine 85 adjusts the PWM signal 89 and selects a number of the load elements 75 as a function of the voltage of the load terminal 15 and the requested current. For example, through the sensor 129, which is electrically interconnected with the load terminal 15 of the circuit breaker 7 under test, the μC 35 inputs the actual load voltage and increases the duty cycle responsive to decreases of the load voltage below the expected load voltage, and decreases the duty cycle responsive to increases of the load voltage above the expected load voltage. Alternatively, the line voltage may be employed. Furthermore, through the sense resistors 111, the μC 35 inputs the actual load current and responsively adjusts the average current flowing through a number of the selected load elements 75.

As will be discussed below in connection with Example 6, the test switch 43 permits the user to input to the inputs 52 of the μC 35 whether the line and load voltage is expected to be an AC or DC voltage and the desired type (thermal or arc fault) of test: AC arc fault, AC thermal, DC arc fault, and DC thermal.

EXAMPLE 3

Although FIG. 1 shows an AC generator 3, external AC power or DC power may be provided by any suitable external power source. For example, an AC or DC generator or power supply other than the example aircraft AC generator 3 may be employed. The example tester 21 includes a power supply circuit 131 (FIG. 2) structured to receive either an AC voltage from line lead 23 or a DC voltage from line lead 23A. A zero crossing detector (AC LINE SYNC) synchronizes turning on of the AC power IGBTs 109 with half cycles of the alternating current.

EXAMPLE 4

Figure 3:
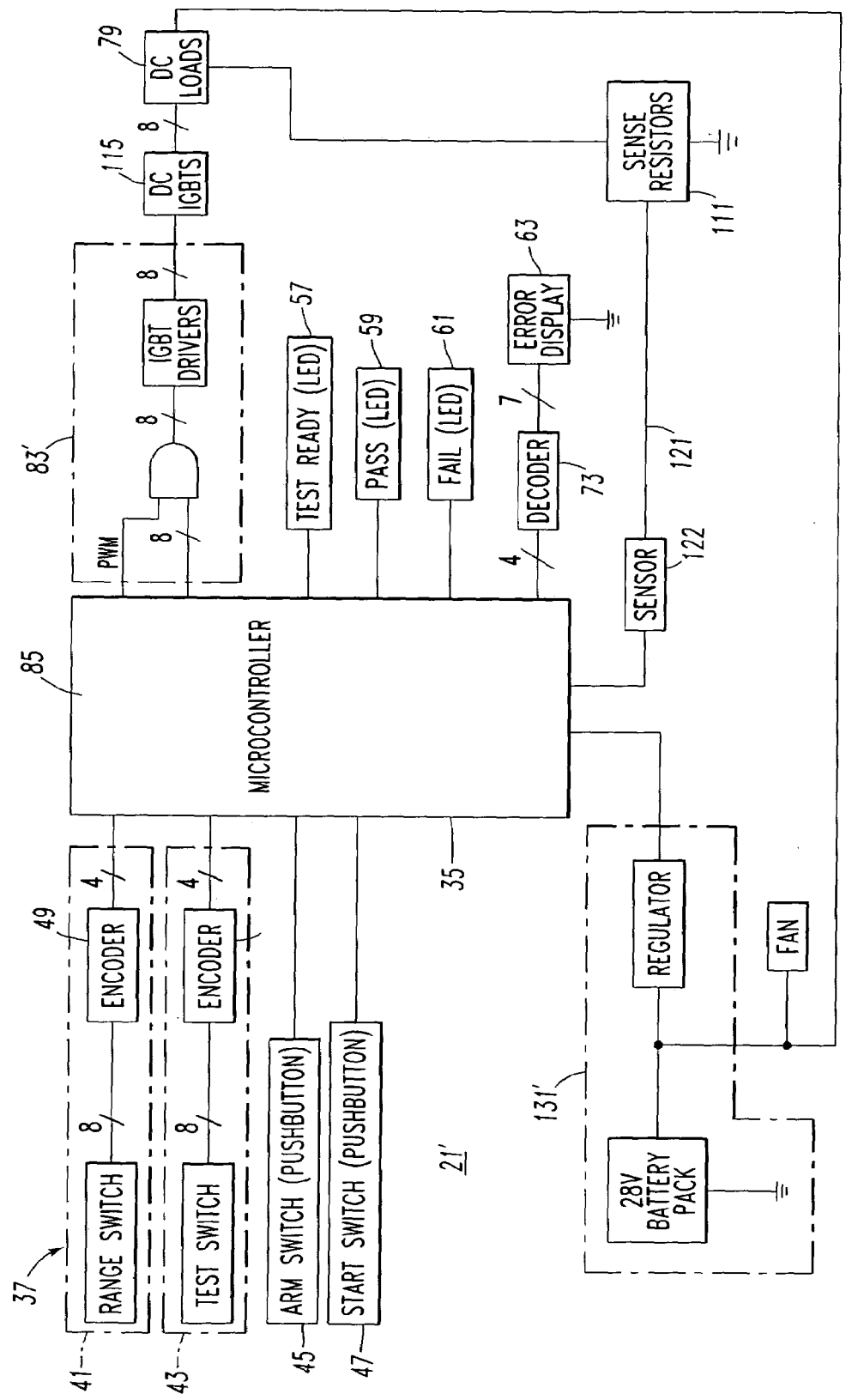
FIG. 3 is a block diagram in schematic form of a tester in accordance with another embodiment of the invention.

FIG. 3 shows another tester 21' that is similar to the tester 21 of FIG. 2. Here, alternatively, a battery pack-based power circuit 131' is employed, such that the tester 21' may be used, for example, in a remote area, without a suitable AC or DC power source, or for demonstration purposes. Here, the PWM circuit 83' is simplified for use with only the DC load resistors 79 and the corresponding power IGBTs 115.

EXAMPLE 5

Figure 12:
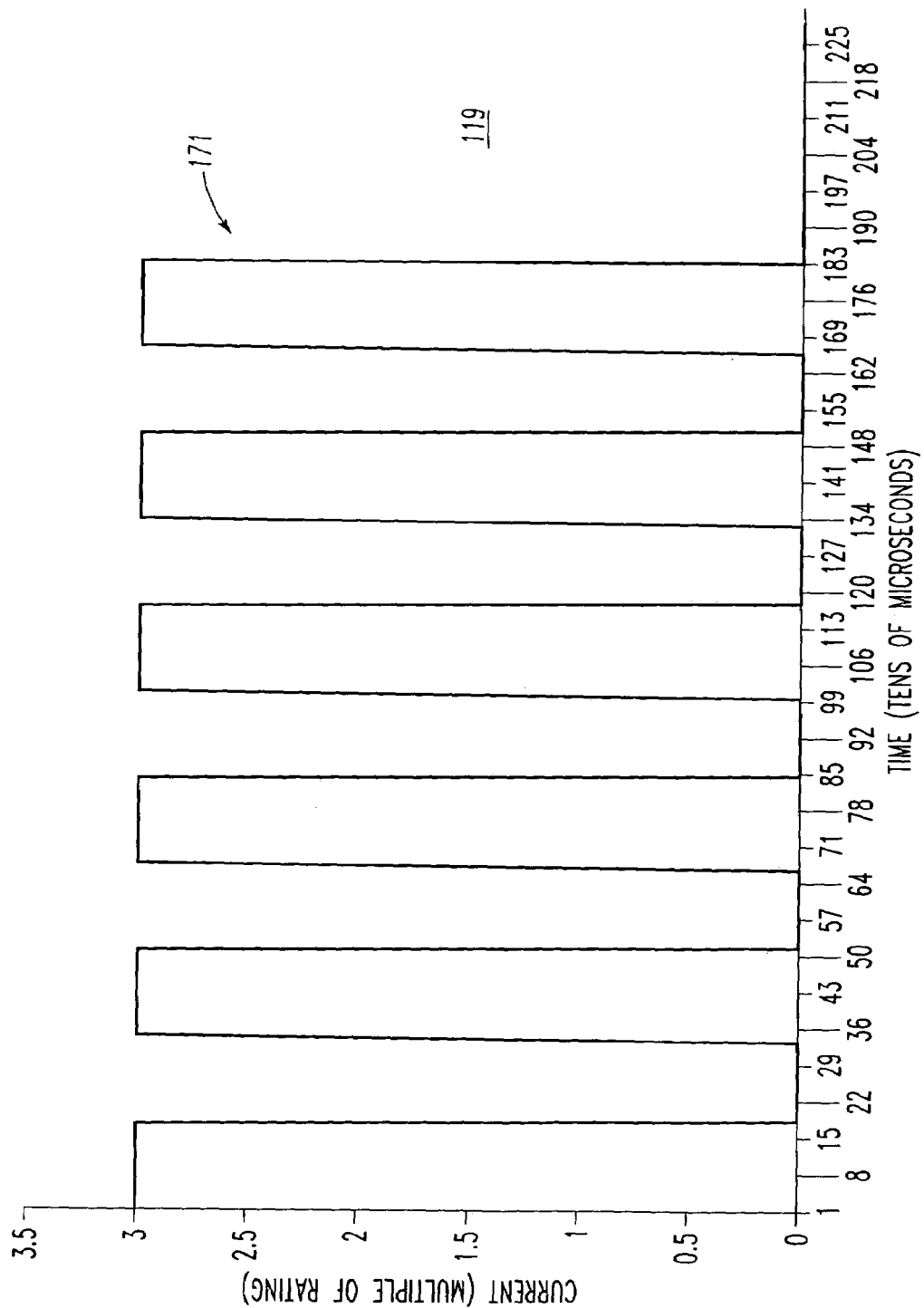
FIG. 12 is a plot of the DC arc waveform as generated by the microcontroller of FIG. 2.

For the AC arc fault test, as selected by the test switch 43, the tester 21 simulates an AC arc fault on the circuit breaker 7 under test and presents the results to the user in the form of a pass status (LED 59 illuminated) or fail status (LED 61 illuminated). The circuit breaker 7 fails the test if it does not interrupt the applied AC test current 113 (FIGS. 8 and 13) within a suitable time (e.g., without limitation, as defined by SAE 5692). Alternatively, the tester 21 simulates a DC arc fault on the circuit breaker 7 under test and presents the results to the user in the form of a pass status (LED 59) or fail status (LED 61). The circuit breaker 7 fails the test if it does not interrupt three times the rated load current modulated at 3 kHz within 20 ms, such as DC test current 119 (FIGS. 9 and 12).

As another alternative, the tester 21 tests a simple overload fault or AC thermal test on the circuit breaker 7 under test on AC loads and presents the pass or fail status to the user. The circuit breaker 7 fails the test if it does not interrupt five times the rated load current within 2 seconds.

As a further alternative, the tester 21 tests a simple overload fault or DC thermal test on the circuit breaker 7 under test on DC loads and presents the pass or fail result to the user. The circuit breaker 7 fails the test if it does not interrupt five times the rated load current within 2 seconds.

EXAMPLE 6

The tester 21 includes the test switch 43, the current range switch 41, the arm pushbutton 45, the start pushbutton 47, a green power indicator 133 (FIG. 5), the green test armed indicator 57, the green test pass indicator 59, the red test fail indicator 61 and the seven-segment single digit error indicator 63. The test switch 43 allows the operator to select the test to be performed (e.g., without limitation, AC arc test; AC thermal test; DC arc test; DC thermal test). In the event that a test is selected which does not match the present operating mode of the circuit breaker 7 under test (e.g., a DC test is selected when the tester 21 is connected to an AC source), then the tester 21 does not allow the specified test to be armed. For example, the μC routine 85 is responsive to the voltage of the load terminal 15 of the circuit breaker 7 under test as sensed by the sensor 129 (FIG. 2). The seven-segment single digit error indicator 63 provides an indication (e.g., without limitation, code 4) that the tester 21 is not ready to perform a test when the line voltage is less than a predetermined value (e.g., without limitation, 105 VAC or 22 VDC).

The current range switch 41 allows the operator to select the current range (e.g., without limitation, 2.5 A; 5 A; 7.5 A; 10 A; 15 A; 20 A; 25 A) of the circuit breaker 7 under test.

The arm pushbutton 45 allows the operator to arm the tester 21 for the next test to be performed. The start pushbutton 47 allows the operator to start the next test.

The green power indicator 133 indicates to the operator that the tester 21 has a suitable line voltage (e.g., AC; DC). This indicator 133, however, does not indicate whether the power source is suitable to test a particular circuit breaker 7. That determination is made during the arming procedure as will be discussed. The green test armed indicator 57 indicates that the selected test has been armed, that the line voltage is within a predetermined range or limit, that the current available is sufficient to perform the requested test, and that the test is ready to be started. The green test pass indicator 59 indicates to the operator that the circuit breaker 7 has passed the test which has just been completed. Conversely, the red test fail indicator 61 indicates to the operator that the circuit breaker 7 has failed the test which has just been completed. The seven-segment single digit error indicator 63 flashes a code as a result of an attempt to arm a particular test to indicate why that attempt failed.

The tester 21 includes a first connector (not shown) including AC test connections for the line lead 23, load lead 25 and return (ground) lead 27 of FIG. 1, and a separate second connector (not shown) for the DC test connections for the DC line lead, DC load lead and return (ground) lead of a DC circuit breaker. The load and return cables are suitably sized to handle the maximum test current used by the tester 21.

The line lead 23 is preferably directly connected at the circuit breaker 7 under test. This electrical connection is employed to power the tester 21.

EXAMPLE 7

Figure 6:
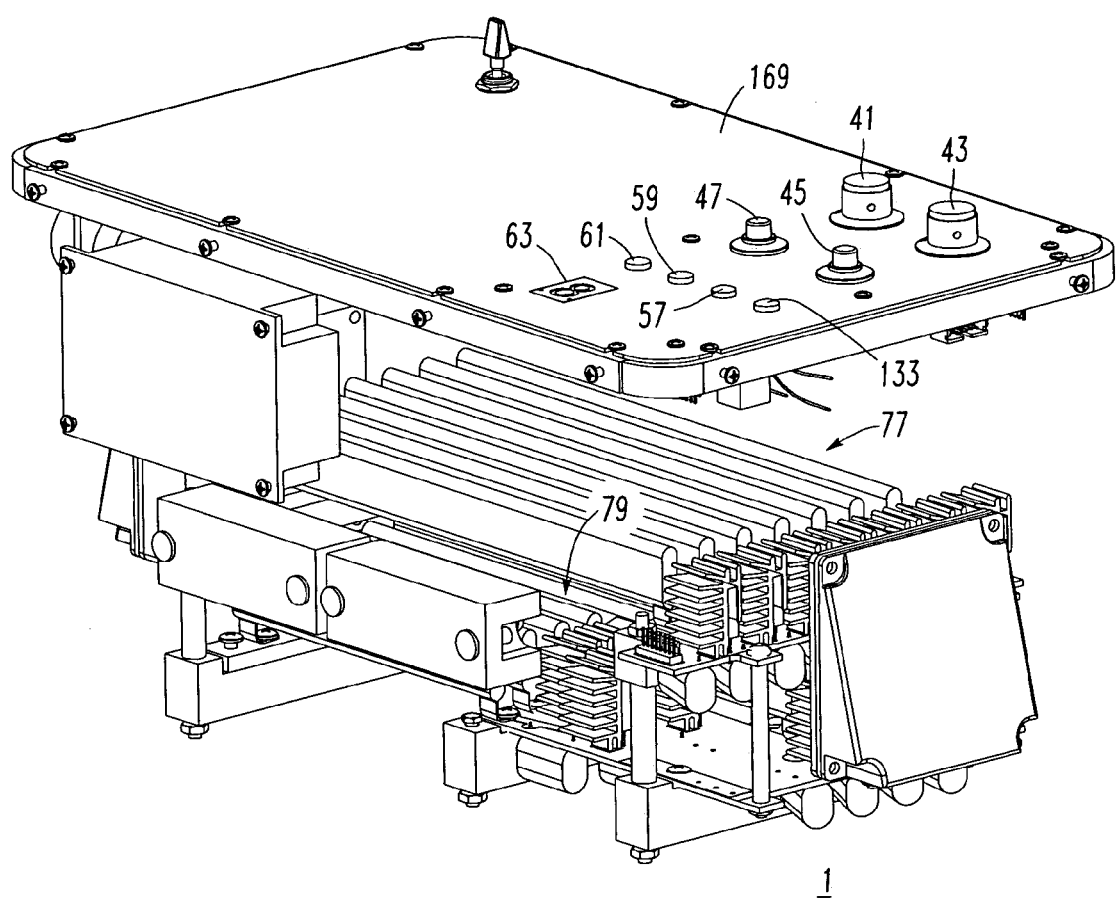
FIG. 6 is an isometric view similar to FIG. 5 but with the base removed to show internal structures.

The load elements 75 (a number of AC load elements 77 and a number of DC load elements 79) employed by the tester 21 are preferably suitably constructed, bulk ceramic power-devices that withstand an operating temperature of about 350 8C without experiencing long-term degradation. Examples of the load elements 75 as employed by the tester 21 are shown in Table 1 and have suitable nominal fixed impedances (e.g., predetermined resistance values) in order to perform specific test functions. The AC load elements 77 and the DC load elements 79 are shown in FIG. 6.

TABLE 1

| Nominal value (Ω) | Quantity | Length (in.) | Function |
|---|---|---|---|
| 5.2 | 1 | 10 | DC load up to 5 A; employed by 2× 2.5 A arc fault; available for DC thermal |
| 2.6 | 1 | 10 | DC load up to 10 A; employed by 2× 5 A arc fault; available for DC thermal |
| 1.3 | 2 | 10 | DC load up to 20 A; 1 employed by 2× 10 A arc fault; available for DC thermal |
| 0.80 | 4 | 6 | DC load up to 30 A; 1 employed by 2× 15 A arc fault; available for DC thermal |
| 15 | 1 | 10 | AC load up to 7.5 A; reserved for 3× (3 times rated current) 2.5 A arc fault; available for AC thermal |
| 7.6 | 1 | 10 | AC load up to 15 A; employed by 6× (6 times rated |

TABLE 1-continued

| Nominal value (Ω) | Quantity | Length (in.) | Function |
|---|---|---|---|
| 3.8 | 5 | 10 | current) 2.5 A or 3× (3 times rated current) 5 A arc fault; available for AC thermal AC load up to 30 A; 1 employed by 6× (6 times rated current) 5 A or 3× (3 times rated current) 10 A arc fault; available for AC thermal |

For example, where the current range is 2.5 A, the AC arc fault, AC thermal, DC arc fault and DC thermal test current values are 15 A, 12.5 A, 5 A and 12.5 A, respectively. These test current values are obtained by the 15 A AC resistor at a nominal 99.13% PWM duty cycle, by the 15 A AC resistor at a nominal 83.33% PWM duty cycle, by the 10 A DC resistor at a nominal 50.00% PWM duty cycle, and by one of the 20 A DC resistors at a nominal 62.50% PWM duty cycle, respectively.

As another example, where the current range is 25 A, the AC arc fault, AC thermal, DC arc fault and DC thermal test current values are 150 A, 125 A, 50 A and 125 A, respectively. These test current values are obtained by all five of the 30 A AC resistors at a nominal 99.13% PWM duty cycle, by all five of the 30 A AC resistors at a nominal 83.33% PWM duty cycle, by two of the 30 A DC resistors at a nominal 83.33% PWM duty cycle, and by all four of the 30 A DC resistors and one of the 20 A DC resistors at a nominal 89.29% PWM duty cycle, respectively.

EXAMPLE 8

Some of the load elements 75 may have different (e.g., due to manufacturing tolerances or component aging) values of the nominal fixed impedance. The µC routine 85 is preferably structured to select a suitable number of the load elements 75, to select a corresponding number of the power IGBTs 81 and to sense the test current 113,119, in order to suitably accurately provide as the actual test current the designated rated current for the circuit breaker 7 under test.

As shown in the example of Table 1, some of the example load elements 75 have the same values of the nominal fixed impedance. The µC routine 85 is preferably structured to employ different ones of the load elements 75 having one of the same values of the nominal fixed impedance for subsequent tests of the circuit breaker 7 under test (or of a different one of the circuit breakers 7), in order to avoid overheating of the different load elements 75.

Some of the load elements may have minimum values of the nominal fixed impedance. The µC 35 may be further structured to delay some of the tests employing the load elements having the minimum values of the nominal fixed impedance for subsequent tests of the circuit breaker 7 under test or of at least one different circuit breaker, in order to avoid overheating of a number of the load elements 75 having the minimum values of the nominal fixed impedance.

EXAMPLE 9

The tester µC 35 preferably provides supervision and control of the circuit breaker tests. For example, due to load device heat dissipation limitations, the µC 35 preferably limits how frequently a particular thermal test may be performed. For example, this occurs at the two highest example available current levels (20 A and 25 A), in order to control the peak temperature of the load elements 75.

Preferably, a single thermal test failure does not result in a thermal timer lockout condition that delays the next test. Also, at lower current ratings, load redundancy is preferably employed such that alternate load elements are selected for subsequent tests in order to prevent the need to enforce a load device cool-down delay. For example, for the current range of 5 A, in the AC arc fault test, the AC test current is 30 A and one of the five 30 A AC resistors (Table 1) is employed for one test, while another of those five 30 A AC resistors is employed for the next test.

EXAMPLE 10

AC and DC thermal tests are run at five times the circuit breaker rating. For example, a thermal test being run on a 25 A rated circuit breaker employs a 125 A test current through the circuit breaker 7 under test and through the tester 21. For example, 125 A employs several of the load elements 75 being turned on at the same time and at a suitable PWM duty cycle, in order to allow sufficient test current to flow. In this example, the resistors heat up and need a suitable cooling off period. For example, the µC routine 85 does not run another test with those same resistors for at least about 10 seconds, in order to allow the resistors to have a suitable cooling time. The timer 137 for this delay is within the example µC 35.

Alternatively, for relatively smaller rated circuit breakers (e.g., 2.5 A), the five-times thermal test current rating is much lower (e.g., 12.5 A for a 2.5 A rated circuit breaker). Hence, one resistor is turned on (e.g., the current through one of the 20A or 30 A resistors is pulse width modulated to allow 12.5 A to flow). The other 20 A or 30 A resistors are unused in this example test. Therefore, the µC routine 85 cycles through the unused resistors in order to eliminate the need for a wait time between tests. After all of the 20 A and/or 30 A resistors have been cycled through, the first resistor has cooled sufficiently to begin the cycle again. Hence, this eliminates any wait time between tests.

Figure 10:
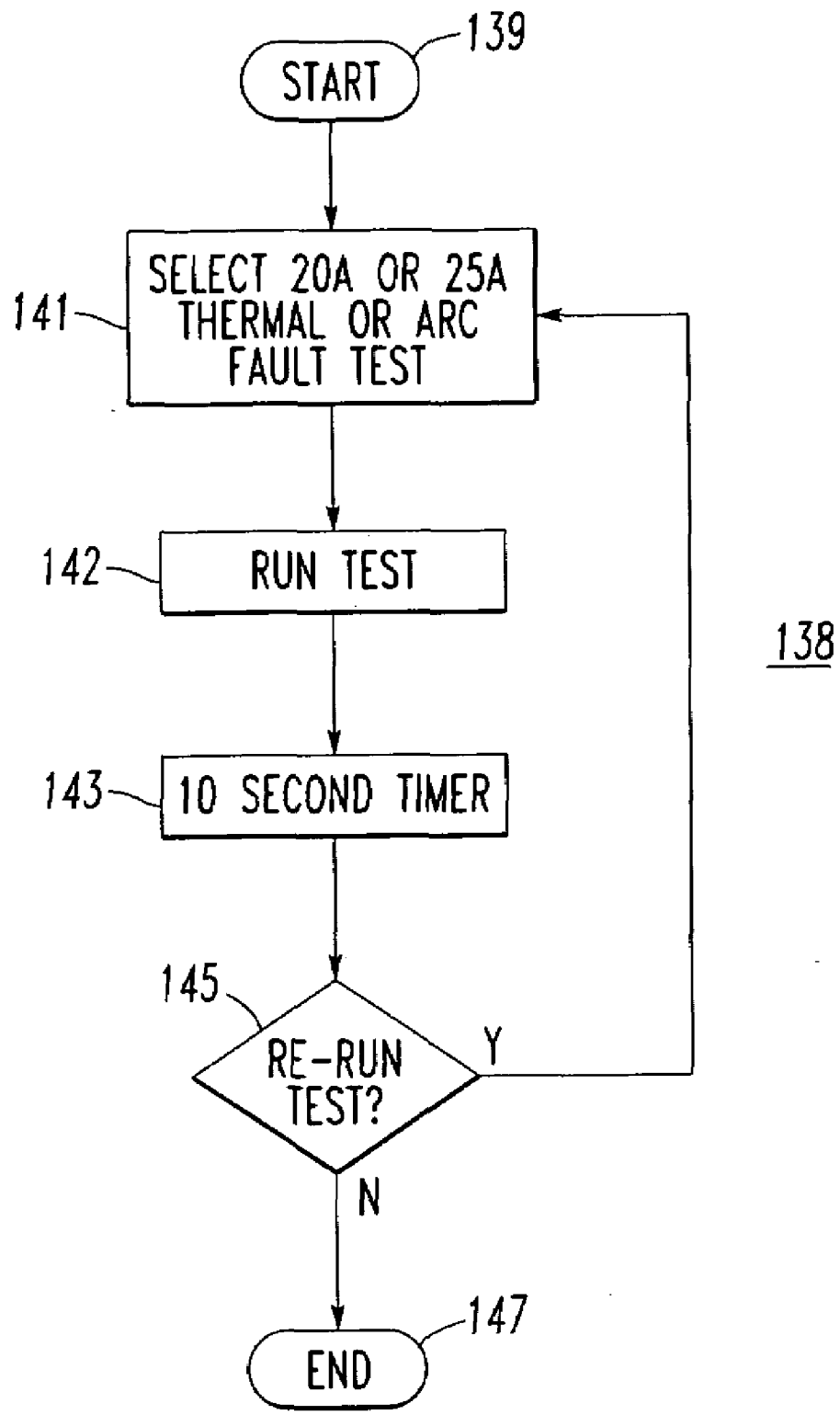
FIG. 10 is a flowchart showing use of the microcontroller timer of FIG. 2.

As shown in FIG. 10, a routine 138 is employed for either the 20 A or the 25 A rated current range for either the thermal test or the arc fault test. After starting at 139, the appropriate one (e.g., 100 A DC thermal; 125 A DC thermal; 100 A AC thermal; 125 A AC thermal) of the tests is selected at 141. Then, at 142, the selected test is run. Next, at 143, the timer 137 times for the example 10 seconds. At 145, it is determined if the test is to be re-run. If so, then step 141 is repeated. Otherwise, the routine 138 exits at 147.

EXAMPLE 11

As was discussed above in connection with FIG. 2, in accordance with an important aspect of the invention, the tester µC routine 85 employs PWM. For example, when a thermal test or an arc fault test is selected to be armed, the actual current delivered to the load is monitored and adjusted in order to accommodate the line voltage and line resistance variations which are commonly encountered in field testing.

Figure 11:
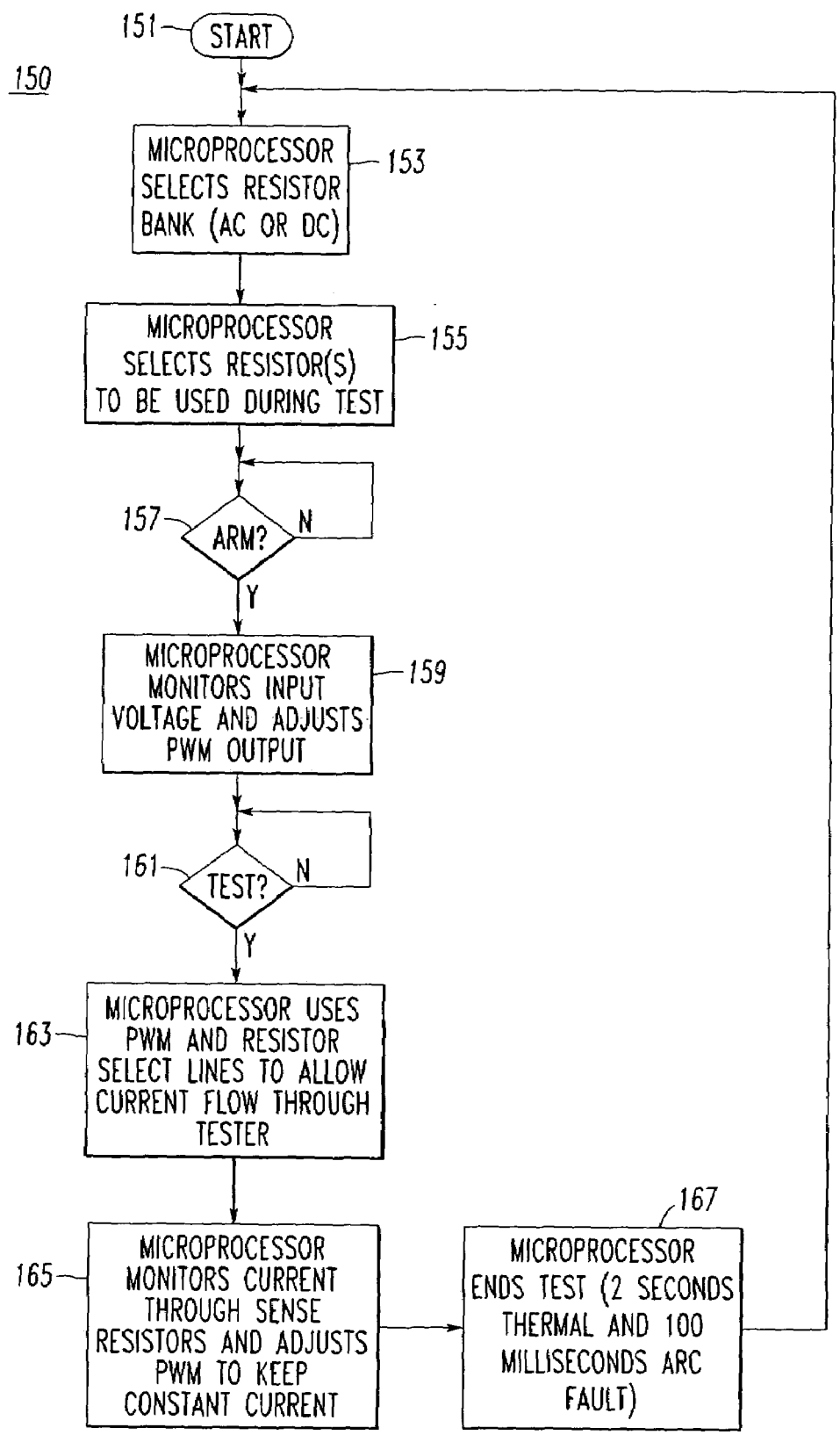
FIG. 11 is a flowchart of the test process of the microcontroller of FIG. 2 in accordance with another embodiment of the invention.

FIG. 11 shows a test routine 150 executed by the µC 35 of FIG. 2. After starting at 151, the µC 35 selects one of the sets of AC load elements 77 and DC load elements 79, at 153, based upon the test or mode (e.g., AC or DC; thermal or arc fault) selected by the test switch 43. Next, at 155, based upon the selected test or mode and the selected current range from the range switch 41, the µC 35 selects a number of the selected one of the sets of AC load elements 77 and DC load elements 79. At 157, in response to the arm switch 45, the μC 35 determines if the line voltage as sensed by the proper one of the AC sensor 135 or DC sensor 158 of FIG. 2 is at a sufficient voltage to run the selected test. Also, the μC 35 determines that the voltage of the load terminal 15 of the circuit breaker 7 under test is sufficient (e.g., about equal to the line voltage) to indicate that such circuit breaker is closed prior to turning on any of the power IGBTs 81. If either of these two tests fails, then the arming step 157 is repeated. Otherwise, at 159, a suitable value of the PWM signal 89 is output and adjusted. This PWM signal 89 turns on and off an enabled number of the power IGBTs 81 to allow an average current through the selected load elements 75. The PWM signal 89 is initially determined by the amount of input line voltage and provides a suitable first pass approximation of the test current that is needed for the selected test. Next, at 161, it is determined if the start pushbutton 47 is selected. If not, then step 161 is repeated. Otherwise, at 163, both the PWM signal 89 and a number of the selected AC resistor select outputs 91 or the selected DC resistor select outputs 93 are output, in order to allow test current to flow through the tester 21 and the circuit breaker 7 under test. Next, at 165, the μC 35 monitors the sensed current signal 121, in order to make adjustments to the PWM signal 89 and compensate for any variability within the tester 21 (e.g., resistor tolerances; voltage variations). Finally, after a suitable time (e.g., without limitation, two seconds for a thermal test; 100 ms for an arc fault test) as timed by the timer 137, the μC 35 ends the test and reports the result. For example, the test is successful if the voltage of the load terminal 15 of the circuit breaker 7 under test is about zero, which indicates that such circuit breaker is tripped in response to the test current.

The μC 35 employs the timer 137 in the event that the circuit breaker 7 under test does not operate properly and trip. The timer 137, thus, protects the tester 21 from damage (e.g., overheating) due to a failed circuit breaker. This also ensures that the circuit breaker 7 under test timely trips. For example, the timer 137 is set for the maximum time of most thermal circuit breakers at 500% rated current.

EXAMPLE 12

Figure 5:
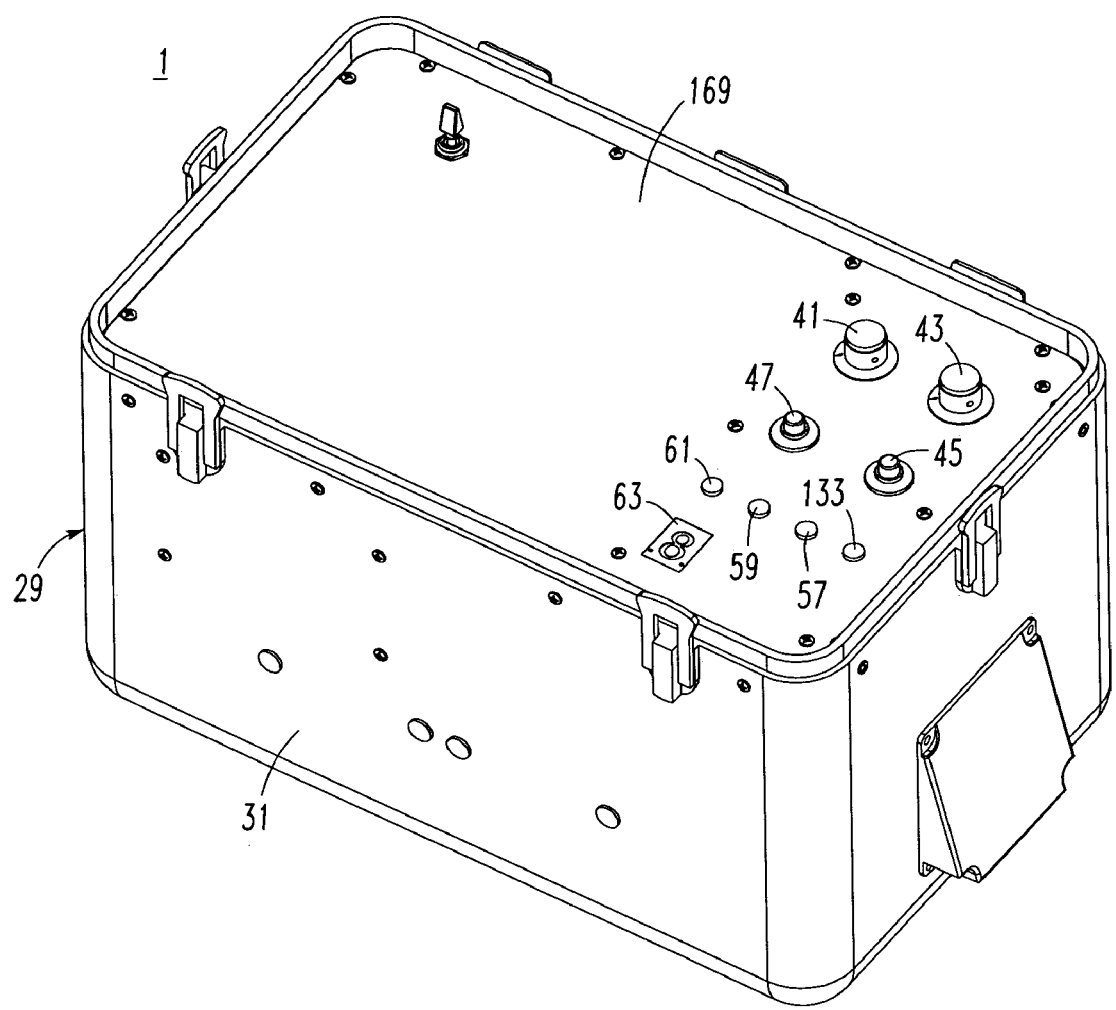
FIG. 5 is an isometric view similar to FIG. 4 but with the cover removed.

The tester 21 performs several processes when using the PWM signal 89 and selecting the proper number of load elements 75 to employ during testing. The operator first connects the tester 21 to the circuit breaker 7 under test. FIG. 5 shows the front panel 169 of the tester 21. Next, the operator places the tester 21 into one of four operating modes: AC arc fault, AC thermal, DC arc fault, and DC thermal by employing the test switch 43. Since the tester 21 includes two sets of load elements 75: AC resistors 77 for AC arc fault or AC thermal, and DC resistors 79 for DC arc fault or DC thermal (Table 1), the position of the test switch 43 is reported to the μC 35, which uses the position to select the proper resistor bank.

Next, the operator places the tester 21 into one of the current ranges (e.g., 2.5 A; 5 A; 7.5 A; 10 A; 15A; 20 A; 25 A) by employing the range switch 41. The position of the range switch 41 is reported to the μC 35, which position informs the μC 35 which number of resistor(s) to use within the previously selected AC or DC resistor bank as was determined by the position of the test switch 43.

Next, the operator presses the arm pushbutton 45. In response, the μC 35 tests the input line voltage for the following: amplitude, AC or DC, and AC frequency. With this information and the knowledge of the nominal value of the resistor(s) as were determined by the switches 41,43, the μC 35 determines where to initially set the PWM percentage value (e.g., between about 1% and about 99.5%). The operator then presses the start pushbutton 47. In response, the μC 35 employs the PWM signal 89 in combination with the resistor select outputs 91,93 (FIG. 2) to allow the specified current, as determined by the range switch 41, to flow through the selected tester load element(s) 75.

After the test is activated, the test current flows through the tester 21 and through the circuit breaker 7 under test. The test current also flows through the sense resistors 111. The amount of current flowing through the sense resistors 111 is reported to the μC 35. In response, the μC 35 changes the PWM signal 89, if needed, to make suitable adjustments to the test current in order to provide a suitably accurate current flow. This compensates for tolerances within the tester 21, such as, for example, the load elements 75 and cables (not shown).

Therefore, there are several factors that determine the duty cycle of the PWM signal 89 and the resistor selection including: the test switch 43, the range switch 41, the input line voltage, the frequency of the input voltage (e.g., the frequency is employed to help set the PWM duty cycle; the frequency changes the duration of time that energy is across the loads), and tolerances within the tester 21. The tester 21 employs the PWM signal 89 to adjust the amount of test current in order to compensate for variances in input power (e.g., which varies, for example, from one aircraft to another), cabling, and internal resistor tolerances. Also, because at least some of the resistor values are repeated, resistor cool down time is minimal, except for the example 20 A and 25 A tests. Those 20 A and 25 A tests use most of the available resistors within the selected AC or DC resistor bank. Therefore, a 10 second wait time between tests is incorporated within the μC 35 to allow for the power resistors to suitably cool.

EXAMPLE 13

The tester 21 may employ custom arc waveforms, although the complexity of the resultant arc fault test waveform might have a tendency to "confuse" the arc test algorithms which may be present in certain arc fault circuit breakers.

EXAMPLE 14

The example tester 21 is housed in the suitcase-like enclosure 29 made of aluminum, which is less than about 12 in. by 12 in. by 24 in. and weighs less than about 40 pounds.

EXAMPLE 15

The AC power employed to perform the tests ranges from about 105 to about 125 $VAC_{RMS}$ (115 $VAC_{RMS}$ at about 50 Hz to about 400 Hz. Preferably, the average available current is approximately 1 A higher than five times the current rating of the highest rated circuit breaker 7 to be tested.

The DC power employed to perform the tests ranges from about 22 to about 29 VDC (28 VDC nominal). Preferably, the available current is approximately 3 A higher than five times the current rating of the highest rated circuit breaker 7 to be tested.

EXAMPLE 16

The μC routine 85 is preferably structured to control an arc fault test of the circuit breaker 7 under test including a selected one of an alternating current arc fault waveform 173 having a substantial step change, and a direct current arc fault waveform 171 having a first predetermined frequency and a magnitude of about a second predetermined multiple of the designated rated current of the circuit breaker 7 under test.

FIG. 12 shows the plot of the example DC arc waveform 171 as generated by the μC routine 85. The example DC arc fault waveform 171 is a 3 KHz square wave that has a current value three times the rating of the circuit breaker 7 under test. The waveform 171 lasts for about 20 ms.

Figure 13:
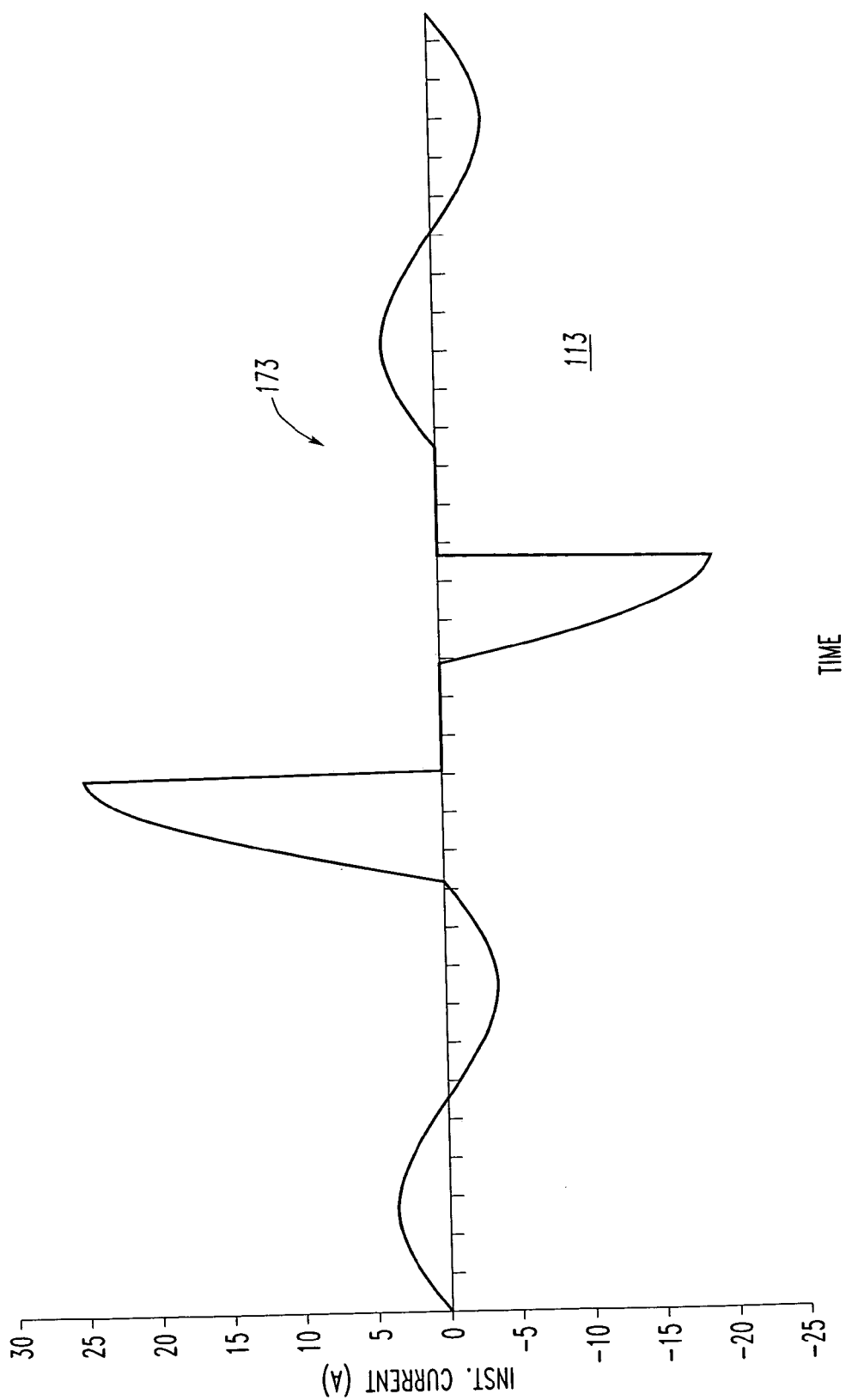
FIG. 13 is a plot of the AC arc waveform as generated by the microcontroller of FIG. 2.

FIG. 13 shows is a plot of the example AC arc waveform 173 as generated by the μC routine 85. The example AC arc fault tests employ this suitable di/dt waveform in which the current level increases and then suddenly decreases almost instantly to ground. This is more representative of actual arc faults.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. A tester for testing a circuit breaker under test, said circuit breaker under test including a line terminal, a load terminal having a voltage, and a designated rated current, said tester comprising:
   a plurality of load elements each having a nominal fixed impedance;
   an electronic switch associated with each of said load elements, said electronic switch, when turned on, electrically connecting a corresponding one of said load elements in series with the load terminal of said circuit breaker under test and in parallel with none or with a number of other of said load elements electrically connected in series with said load terminal;
   a controller structured to turn on a number of said electronic switches selected to draw through a corresponding number of said load elements a test current selected as a function of the designated rated current for said circuit breaker under test and sufficient to trip open said circuit breaker under test; and
   a pulse width modulation circuit cooperating with said controller and with said electronic switches associated with said load elements, said pulse width modulation circuit being structured to provide a constant magnitude of said test current to accommodate variations of said nominal fixed impedance or variations of the voltage of said load terminal.

2. The tester of claim 1 wherein said controller includes a processor having a routine, a first output with a pulse width modulation signal and a plurality of second outputs, one for each of said electronic switches; wherein said pulse width modulation circuit includes a plurality of AND functions, one for each of said electronic switches, each of said AND functions including a first input inputting a corresponding one of the second outputs of said processor, a second input inputting said first output with said pulse width modulation signal, and a third output controlling a corresponding one of said electronic switches; and wherein the routine of said processor is structured to provide said constant magnitude of said test current to accommodate said variations of said nominal fixed impedance and said variations of the voltage of said load terminal.

3. The tester of claim 1 wherein said pulse width modulation circuit includes a pulse width modulation signal having a duty cycle; and wherein said controller includes a sensor electrically interconnected with the load terminal of said circuit breaker under test, said controller increasing said duty cycle responsive to decreases of the voltage of said load terminal, said controller decreasing said duty cycle responsive to increases of the voltage of said load terminal.

4. The tester of claim 3 wherein said controller further includes an indicator and an arming mechanism responsive to the voltage of said load terminal of said circuit breaker under test; and wherein said indicator provides an indication that said tester is not ready to perform a test when the voltage of said load terminal is less than a predetermined value.

5. The tester of claim 1 wherein said controller includes a circuit structured to confirm that the voltage of said load terminal of said circuit breaker under test is sufficient to indicate that said circuit breaker under test is closed prior to turning on any of said electronic switches.

6. The tester of claim 1 wherein the voltage of said load terminal is selected from the group consisting of an alternating current voltage and a direct current voltage.

7. The tester of claim 1 wherein said controller includes a first input structured to select an expected voltage of said load terminal as one of an alternating current voltage and a direct current voltage, and a second input structured to select one of an arc fault test and a thermal test for the selected one of said alternating current voltage and said direct current voltage.

8. The tester of claim 1 wherein some of said load elements have different values of said nominal fixed impedance; and wherein said controller is structured to sense said test current and to select a number of said load elements and a corresponding number of said electronic switches, in order to provide as said test current the designated rated current for said circuit breaker under test.

9. The tester of claim 8 wherein some of said load elements have the same values of said nominal fixed impedance; and wherein said controller is further structured to employ different ones of said load elements having one of said same values of said nominal fixed impedance for subsequent tests of said circuit breaker under test or of at least one different circuit breaker, in order to avoid overheating of said different ones of said load elements having said one of said same values of said nominal fixed impedance.

10. The tester of claim 8 wherein some of said load elements have minimum values of said nominal fixed impedance; and wherein said controller is further structured to delay some of said tests employing said load elements having said minimum values of said nominal fixed impedance for subsequent tests of said circuit breaker under test or of at least one different circuit breaker, in order to avoid overheating of a number of said load elements having said minimum values of said nominal fixed impedance.

11. The tester of claim 10 wherein said controller is structured to test a range of rated currents including a first designated rated current and a greater second designated rated current, said controller is further structured to control a plurality of thermal tests of said circuit breaker under test including a predetermined multiple of said first designated rated current and said greater second designated rated current, said controller includes a timer structured to delay for a predetermined time a subsequent one of said thermal tests of said circuit breaker under test with said greater second designated rated current, and to not delay a subsequent one of said thermal tests of said circuit breaker under test with said first designated rated current.

12. The tester of claim 1 wherein some of said load elements have different values of said nominal fixed impedance; wherein said controller includes a routine structured to adjust a pulse width modulation signal, a first output to output said pulse width modulation signal and a plurality of second outputs to enable a number of said electronic switches; and wherein each of said electronic switches includes a circuit to turn on the corresponding one of said load elements as a function of said pulse width modulation signal, in order to adjust an average current flowing through said corresponding one of said load elements.

13. The tester of claim 12 wherein some of said load elements have the same values of said nominal fixed impedance; and wherein said controller is structured to employ different ones of said load elements having one of said same values of said nominal fixed impedance for subsequent tests of said circuit breaker under test or of at least one different circuit breaker, in order to avoid overheating of said different ones of said load elements having said one of said same values of said nominal fixed impedance without delaying said tests.

14. The tester of claim 1 wherein said pulse width modulation circuit is further structured to maintain said constant magnitude of said test current to accommodate various values of impedance between said tester and said circuit breaker under test.

15. The tester of claim 1 wherein said pulse width modulation circuit includes a sensor to sense said test current and output a sensed current signal; wherein said controller includes a pulse width modulation signal having a variable duty cycle, an input to input said sensed current signal, a routine structured to adjust the duty cycle of said pulse width modulation signal based upon said sensed current signal, and an output to output said pulse width modulation signal; and wherein each of said electronic switches includes a circuit to turn on the corresponding one of said load elements as a function of said pulse width modulation signal, in order to adjust an average current flowing through said corresponding one of said load elements.

16. The tester of claim 1 wherein said controller includes a first input to input the voltage of said load terminal, a second input to input a requested current for said test, an output to output a pulse width modulation signal, and a routine structured to adjust said pulse width modulation signal as a function of said voltage of said load terminal and said requested current; and wherein each of said electronic switches includes a circuit to turn on the corresponding one of said load elements as a function of said pulse width modulation signal.

17. The tester of claim 16 wherein said pulse width modulation circuit further includes a sensor to sense said test current and output a sensed current signal; wherein said controller further includes an input to input said sensed current signal, said routine being further structured to further adjust said pulse width modulation signal based upon said sensed current signal, in order to accommodate said variations of said nominal fixed impedance of said load elements.

18. The tester of claim 1 wherein said controller includes a timer structured to time a first period of time for a first selected test of said circuit breaker under test and a different second period of time for a second selected test of said circuit breaker under test or of a different circuit breaker; and wherein said controller further includes a routine structured to enable one of said first selected test and said second selected test for only said first period of time and said different second period of time, respectively.

19. The tester of claim 1 wherein said controller is structured to control an arc fault test of said circuit breaker under test including a selected one of an alternating current arc fault waveform having a substantial step change, and a direct current arc fault waveform having a first predetermined frequency and a magnitude of about a second predetermined multiple of said designated rated current of said circuit breaker under test.

20. The tester of claim 19 wherein said direct current arc fault waveform persists for a predetermined period of time.

21. The tester of claim 1 wherein said controller is structured to control a thermal test of said circuit breaker under test including a selected one of an alternating current value having a magnitude that is a predetermined multiple of said designated rated current and a direct current value having a magnitude that is a predetermined multiple of said designated rated current.

22. The tester of claim 1 wherein said tester is portable; and wherein said controller is structured to select and test one of a thermal test and an arc fault test for said circuit breaker under test.

* * * * *